United States Patent [19]
Ono

[11] Patent Number: 6,052,007
[45] Date of Patent: Apr. 18, 2000

[54] PHASE CONTROL METHOD AND APPARATUS FOR SYNCHRONIZING DUAL LINK TRANSMISSION SIGNALS

[75] Inventor: Takeshi Ono, Kawasaki, Japan

[73] Assignee: Fujitsu Limited, Kanagawa, Japan

[21] Appl. No.: 09/150,659

[22] Filed: Sep. 10, 1998

[30] Foreign Application Priority Data

Mar. 17, 1998 [JP] Japan ................................ 10-066548

[51] Int. Cl.⁷ ...................................................... H03L 7/06
[52] U.S. Cl. .......................... 327/158; 327/153; 327/161
[58] Field of Search .................................. 327/149, 152, 327/153, 158, 161; 375/375, 376; 331/11, 15, 17

[56] References Cited

U.S. PATENT DOCUMENTS

| | | | |
|---|---|---|---|
| 5,621,774 | 4/1997 | Ishibashi et al. ....................... | 375/371 |
| 5,880,612 | 3/1999 | Kim ........................................ | 327/158 |
| 5,939,912 | 8/1999 | Rehm ..................................... | 327/158 |
| 5,973,525 | 10/1999 | Fujii ....................................... | 327/158 |

FOREIGN PATENT DOCUMENTS 1-296731 11/1989 Japan .
9-181704 7/1997 Japan .

*Primary Examiner*—Tuan T. Lam
*Assistant Examiner*—Quan Tra
*Attorney, Agent, or Firm*—Helfgott & Karas, P.C.

[57] ABSTRACT

A phase control apparatus which enables efficient execution of phase adjustment operations for two transmission signals so that a non-interruptive switchover function will work effectively. The proposed apparatus performs phase control to eliminate a phase difference between two reception signals which originate from a single source, but have been carried over two separate transmission lines. A delay memory unit, placed on each transmission line, delays each reception signal in accordance with a given delay time parameter. A comparison range setting unit defines a time range for phase comparison. Within the defined time range, a phase comparator compares the phases of two reception signals delayed by the delay memory units. If the phase comparison has resulted in an out-of-phase condition, a phase controller repetitively varies the delay time parameter being set in one of the delay memory units until an in-phase condition is reached.

18 Claims, 14 Drawing Sheets

105-1

| LINE QUALITY (R) | DELAY RESTRICTION PARAMETER (X) |
|---|---|
| $10^{-3}$ | 0 |
| $10^{-4}$ | 0 |
| $10^{-5}$ | 15 |
| $10^{-6}$ | 8 |
| $10^{-7}$ | 3 |
| $10^{-8}$ | 1 |
| $10^{-9}$ | 1 |

FIG. 11

PHASE CONTROL METHOD AND APPARATUS FOR SYNCHRONIZING DUAL LINK TRANSMISSION SIGNALS

BACKGROUND OF THE INVENTION

1. Field of the Invention

The present invention relates to a phase control method and apparatus, and particularly to a phase control method and apparatus for eliminating a phase difference between two signals which originate from a single source, but have been carried over two different transmission lines.

2. Description of the Related Art

To accommodate a variety of network interfaces having different specifications, Synchronous Digital Hierarchy (SDH) transmission systems are organized, in general, by a number of network devices with increasingly high system complexity. Further, SDH systems often employ dual-link optical transmission media for higher reliability and availability of service; that is, a single-sourced digital signal is carried over two independent transmission lines. When one transmission line is accidentally disrupted for any reason or intentionally disabled for maintenance operations, the ongoing signal transmission is automatically switched to the other line without any momentary dropout of the transmission signal. For this purpose, the physical layer of such SDH transmission systems is equipped with a non-interruptive switchover mechanism.

FIG. 13 outlines a conventional transmission system having a non-interruptive switchover capability. In this simplified block diagram, a digital transmission signal is delivered from a sending station 200 to a receiving station 300 via a dual transmission link. More specifically, a transmission unit 201 in the sending station 200 produces a path signal P having a Network Node Interface (NNI) frame format. This path signal P is transported over two independent transmission lines A and B in a parallel fashion. Since the lengths of these two lines A and B are different in general, the two path signals P will arrive at the same receiving station 300 at different times. This fact leads to a need for the phase synchronization of signal frames at the receiving end to enable non-interruptive switchover operations.

To solve the problem of such a timing difference, the receiving station 300 employs two delay memory units m1 and m2, which give a certain amount of delay time to one of the two path signals that arrives earlier. With an appropriate setup, the output signals of these delay memory units m1 and m2 will be in phase. Now that two in-phase path signals P are available, the receiving station 300 can select either signal by using a selector 301 in a non-interruptive manner.

FIG. 14 shows a frame structure of path signals, which is simplified for easier understanding of the concept. The SDH standards define a Path Overhead (POH) as part of each NNI frame, which consists of nine bytes for transmission control purposes. Among those control bytes in a POH, J1 byte (path trace byte) and/or H4 byte (multiframe indicator byte) is used to carry an appropriate identifier ID. This identifier ID is inserted not to every frame, but only to the first frame of every predefined multiframe. The length of this multiframe signal is determined taking into consideration the distance difference between the two transmission lines A and B. The transmission device 201 assembles such multiframe signals so that the phase matching will be accomplished, even in such a case where the distance difference causes a time difference exceeding one NNI frame interval. Actually, the arrangement of identifiers ID shown in FIG. 14 will allow the receiving station 300 to compensate for any phase differences if they are within one multiframe length. In this way, the conventional SDH transmission system performs phase adjustment operations by detecting, on the receiving end, a difference in the arrival times of predefined identifiers ID that are embedded in multiframe path signals.

The above-described conventional transmission systems, however, are unable to interwork with other existing network devices having no capabilities of inserting identifiers ID into multiframe signals. This is because the non-interruptive switchover mechanism implemented in the conventional systems requires the sending end to assemble multiframe signals in a prescribed way, as does the sending station 200 in the system of FIG. 13.

Another drawback of the conventional systems is that they consumes control bytes in POH to insert identifiers ID for the phase adjustment purpose, although some applications may require such control bytes for other usage.

Further, the conventional phase detection scheme requires identifiers ID to be inserted into multiframe signals at sending stations, meaning that the comparison range (i.e., a time range in which two path signals should be monitored to detect their phases) is determined not at each receiving end, but on the side of sending stations. This leads to inefficiency in the phase control.

SUMMARY OF THE INVENTION

Taking the above into consideration, an object of the present invention is to provide a phase control apparatus which enables efficient execution of phase adjustment operations so that a non-interruptive switchover function will work effectively.

Another object of the present invention is to provide a phase control method which allows efficient phase matching operations.

To accomplish the first object, according to the present invention, there is provided a phase control apparatus for performing a phase control to eliminate a phase difference between two reception signals which originate from a single source, but have been carried over two transmission lines. This apparatus comprises the following elements:

(a) a first and second delay memory units, respectively disposed on the two transmission lines, which delay the reception signals in accordance with a given delay time parameter;

(b) a comparison range setting unit which sets a time range for phase comparison between the two reception signals;

(c) a phase comparator which compares phases of the two reception signals delayed by the first and second delay memory units, within the time range set by the comparison range setting unit; and (d) a phase control unit which executes the phase control by repetitively varying the delay time parameter being set in either of said first and second delay memory unit while a phase difference is observed by said phased comparison means.

To accomplish the second object, according to the present invention, there is provided a method of eliminating a phase difference between two signals which originate from a single source, but have been carried over two transmission lines. This method comprises the following steps:

(a) placing delay memory units on the individual transmission lines;

(b) defining a time range for phase comparison;

(c) comparing phases of output signals of the delay memory units, within the time range defined in the step (b) of defining; and (d) if the phase comparison in the step (c) of comparing has resulted in an out-of-phase condition, repetitively varying a delay time parameter being set in one of the delay memory units that has received earlier the signal carried over the transmission line.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 11 is a table that associates line quality levels and maximum allowable times of delay setting operations;

DESCRIPTION OF THE PREFERRED EMBODIMENTS

Several embodiments of the present invention will be described below with reference to the accompanying drawings.

Figure 1:
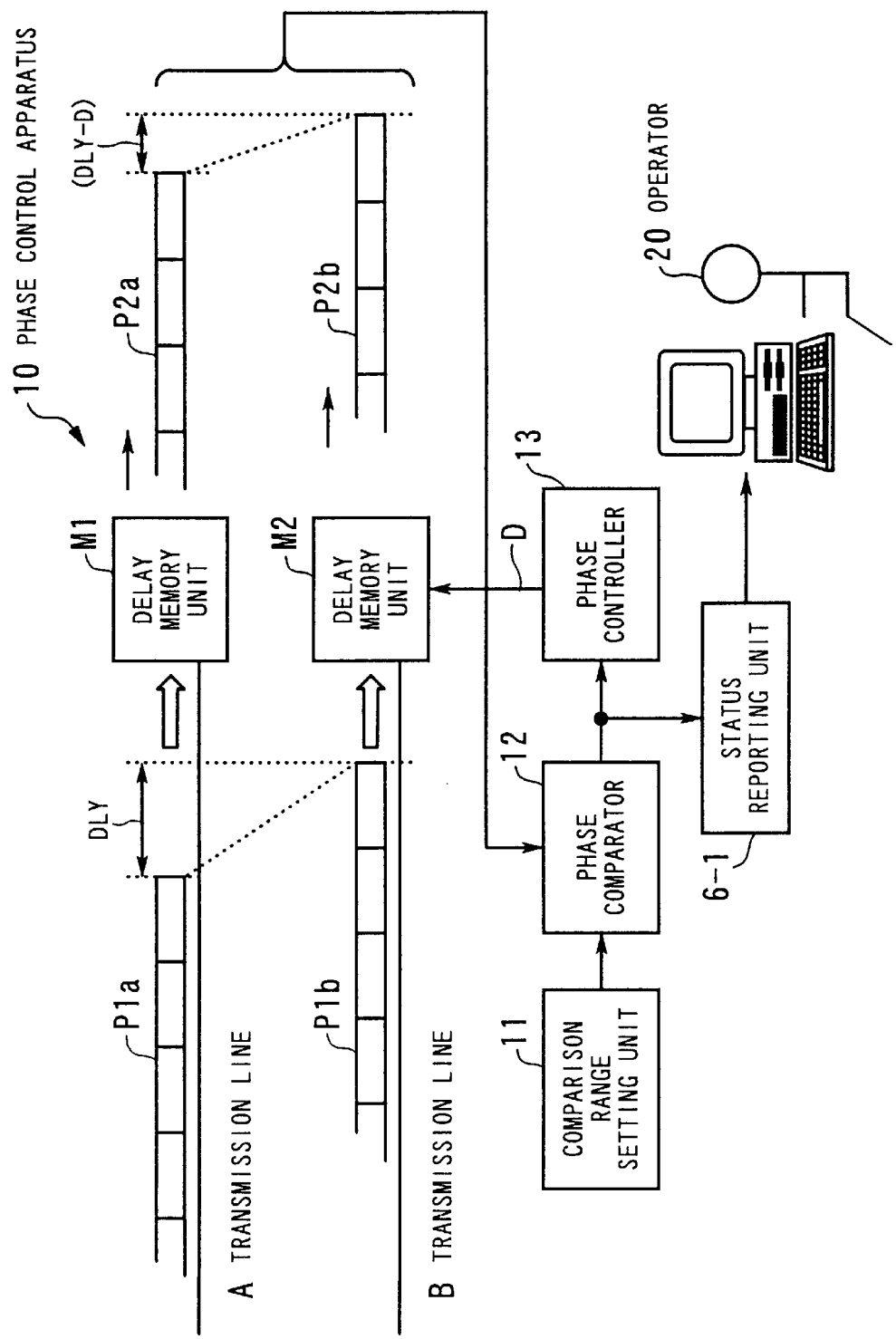
FIG. 1 is a conceptual view of a phase control apparatus of the present invention.

FIG. 1 is a conceptual view of a phase control apparatus of the present invention. This phase control apparatus 10 performs signal phase control to eliminate a phase difference between two identical reception signals which originate from a single source, but have been carried over two different transmission lines. More specifically, in FIG. 1, the phase control apparatus 10 receives two single-sourced "path signals" P1a and P1b which have been carried over two transmission lines A and B configured as a redundant system. The apparatus 10 controls their phase relationships, and then outputs one signal that is selected from among them in a non-interruptive manner.

Delay memory units M1 and M2, respectively disposed on the transmission lines A and B, are programmable devices designed to give a certain amount of time delay to either one of the received path signals P1a and P1b. Here, a delay time parameter D determines the actual delay time. In the example of FIG. 1, the path signal P1b arrives at the phase control apparatus 10 earlier than the other path signal P1a. To compensate for this time difference DLY, an appropriate delay time parameter D is set to the delay memory unit M2. Now that the time difference is reduced to (DLY-D), and the outputs P2a and P2b of the delay memory units M1 and M2 will approach an in-phase condition.

A comparison range setting unit 11 sets a time range in which the phase relationships between the delayed path signals P2a and P2b should be examined. This comparison range is determined by considering commands from an operator 20, the presence of framing errors, and other related factors. Within the comparison range determined in this way, a phase comparator 12 compares the phases of individual frames of the delayed path signals P2a and P2b. If this comparison has revealed any phase difference between them, the phase controller 13 sets a different delay time parameter D to either of the delay memory units M1 and M2 to make another comparison. The phase controller 13 repeats the above phase control cycle, while changing the value of the delay time parameter D.

When a series of phase comparison operations have ended up with unsatisfactory results, the phase controller 13 then attempts to delay the other path signal by changing the destination of the delay time parameter D to the other delay memory unit. More specifically, suppose that the delay memory unit M1 has been assigned as the default destination. Since the path signal P1a comes later than the other path signal P1b, an in-phase condition can never be reached, no matter what delay time parameter D is set to the delay memory unit M1. To resolve this situation, the phase controller 13 switches the destination from the delay memory unit M1 to the other delay memory unit M2, while clearing the delay time set in M1 and initializing the parameter D.

As explained above, the phase control apparatus 10 determines which path signal to retard (or which delay memory unit to be activated), in accordance with a prescribed selection policy. That is, one of the delay memory units M1 and M2 is previously defined as the default destination, and the phase controller 13 is designed to start phase control operations with this default destination. At a certain step in the process of iterative phase adjustment, the phase controller 13 may change the destination of the delay time parameter D according to the comparison results between the path signals P2a and P2b.

As an alternative policy of delay memory selection, it is possible to detect which path signal arrives first and to choose an appropriate delay memory unit on the basis of this detection result. In the present context of FIG. 1, the delay memory unit M1 will be selected since the path signal P1a comes first. This policy minimizes the time required for the convergence of the iterative phase adjustment process, the details of which will be described in later sections as a feature of a second embodiment of the present invention.

Referring to FIG. 1 again, the phase control apparatus 10 further employs a status reporting unit 6-1, which supplies status messages to external recipients, including an operator 20, to indicate the present phase relationship (i.e., in phase or out of phase) between two path signals being monitored. From these status messages, the operator 20 can determine whether the non-interruptive switchover mechanism is ready to operate or not.

Figure 2:
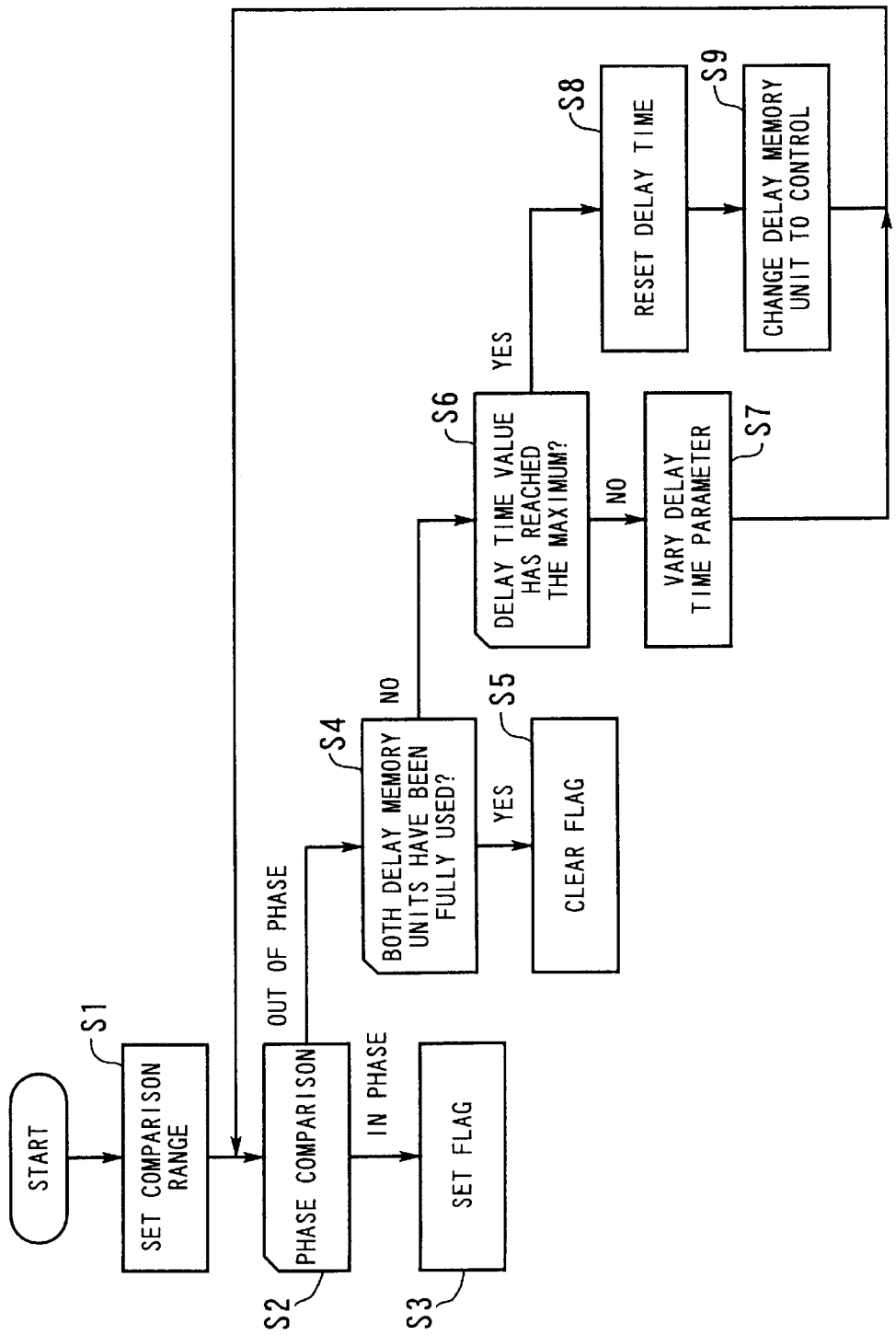
FIG. 2 is a flowchart which shows an operation sequence of the phase control apparatus of the present invention.

Referring next to FIG. 2, the following section will explain the operation of the phase control apparatus 10 according to the present invention. Note here that the following sequence is based on the first-mentioned selection policy, where the delay memory unit M1 is the default destination of the delay time parameter D.

(S1) The comparison range setting unit 11 sets a time range to compare the phases of the path signals P1a and P1b.

(S2) Within the comparison range set in step S1, the phase comparator 12 compares the phases of two delayed path signals P2a and P2b supplied from the delay memory units M1 and M2. If the two signals are in phase, the process advances to step S3. Otherwise, the process branches to step S4.

(S3) Since the phases are matched, the reporting unit 6-1 sets a non-interruptive switchover flag to "1" and then notifies the operator 20 that the non-interruptive switchover function is ready to operate.

(S4) The phase controller 13 determines whether the phase adjustment was fully attempted by using both delay memory units M1 and M2 up to a predetermined maximum delay time. If it was fully attempted, the process goes to step S5. If not, the process advances to step S6.

(S5) Since the in-phase condition has not been reached in spite of all efforts to adjust the delay memory units M1 and M2, the phase controller 13 now concludes that the non-interruptive switchover function cannot operate. Then it notifies the operator 20 of the same, as well as setting a value of "0" to the non-interruptive switchover flag.

(S6) During the iterative adjustment of the delay time parameter D, the phase controller 13 checks whether the delay time value has reached a maximum delay time that the delay memory unit M1 can provide. If it has reached this maximum delay time, the process proceeds to step S8, and otherwise, the process advances to step S7.

(S7) The phase controller 13 gives another delay time parameter D to the delay memory unit being selected at present.

(S8) The phase controller 13 clears the delay time set in the delay memory unit M1 to zero, as well as initializing the delay time parameter D.

(S9) The phase controller 13 switches the destination of the delay time parameter D from the present delay memory unit M1 to the other delay memory unit M2. The process is returned to step S2 for further iteration.

Figure 3:
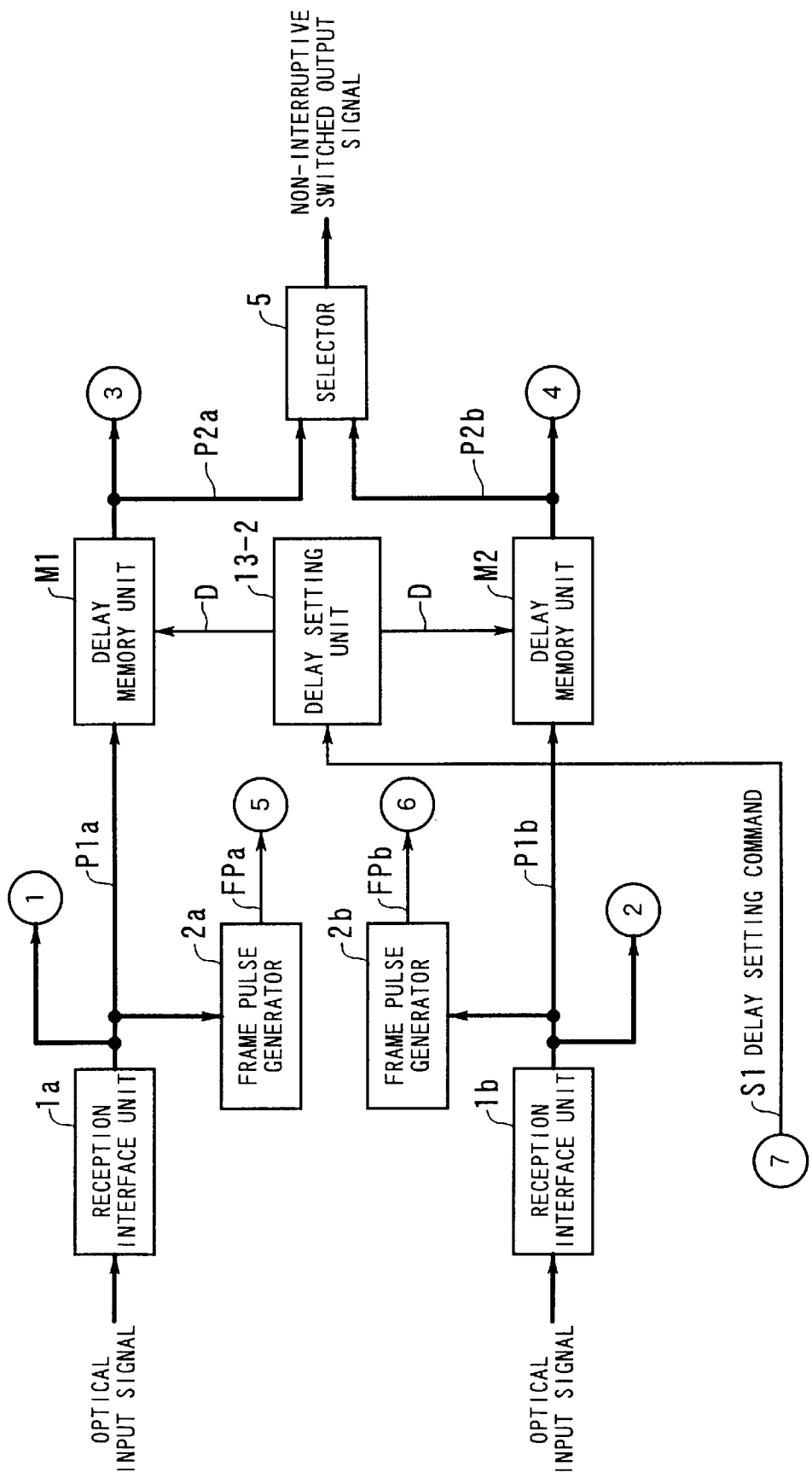
FIGS. 3 to 5 are diagrams which show the structure of a phase control apparatus according to a first embodiment of the present invention.
Figure 4:
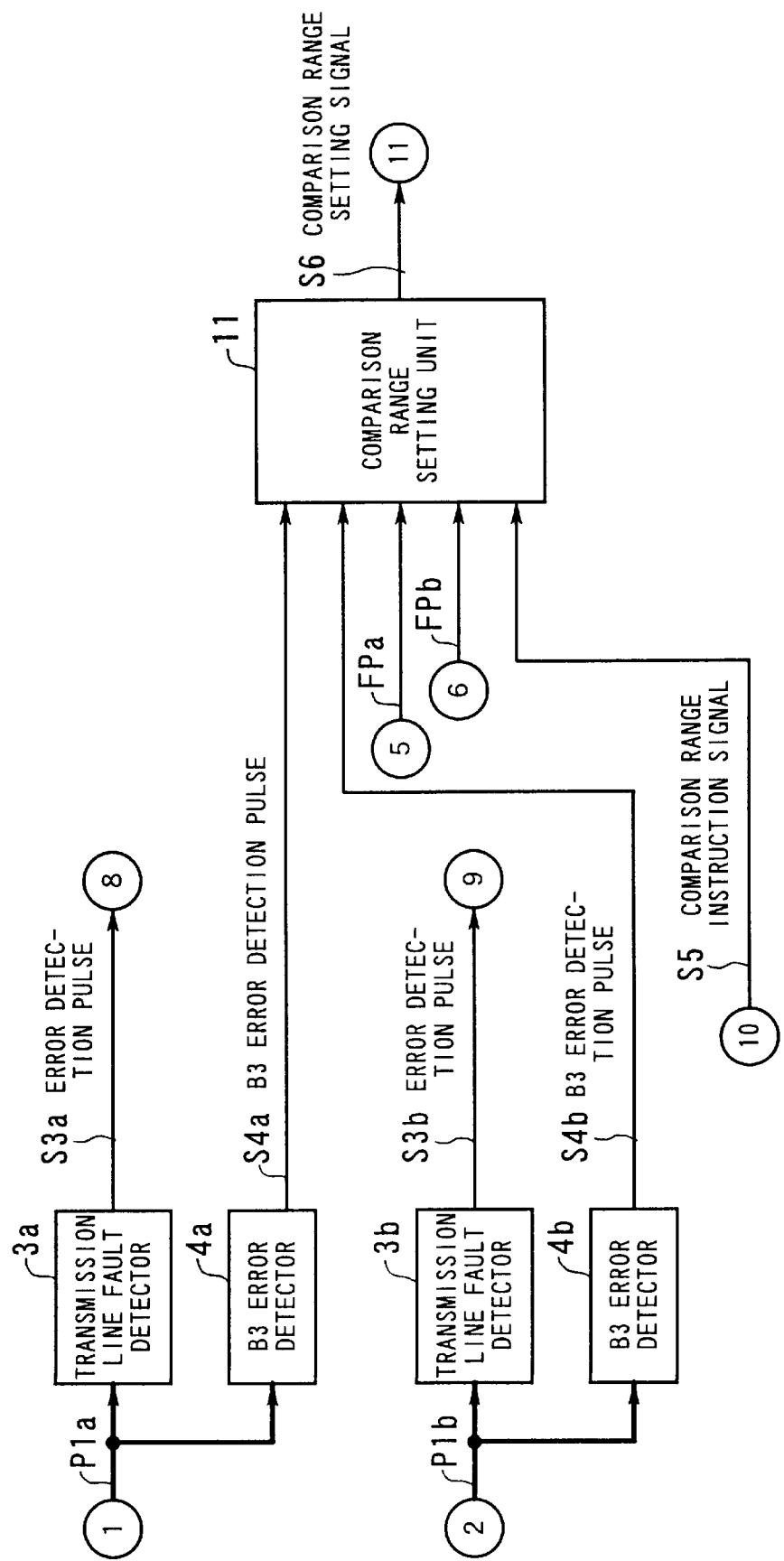
Figure 5:
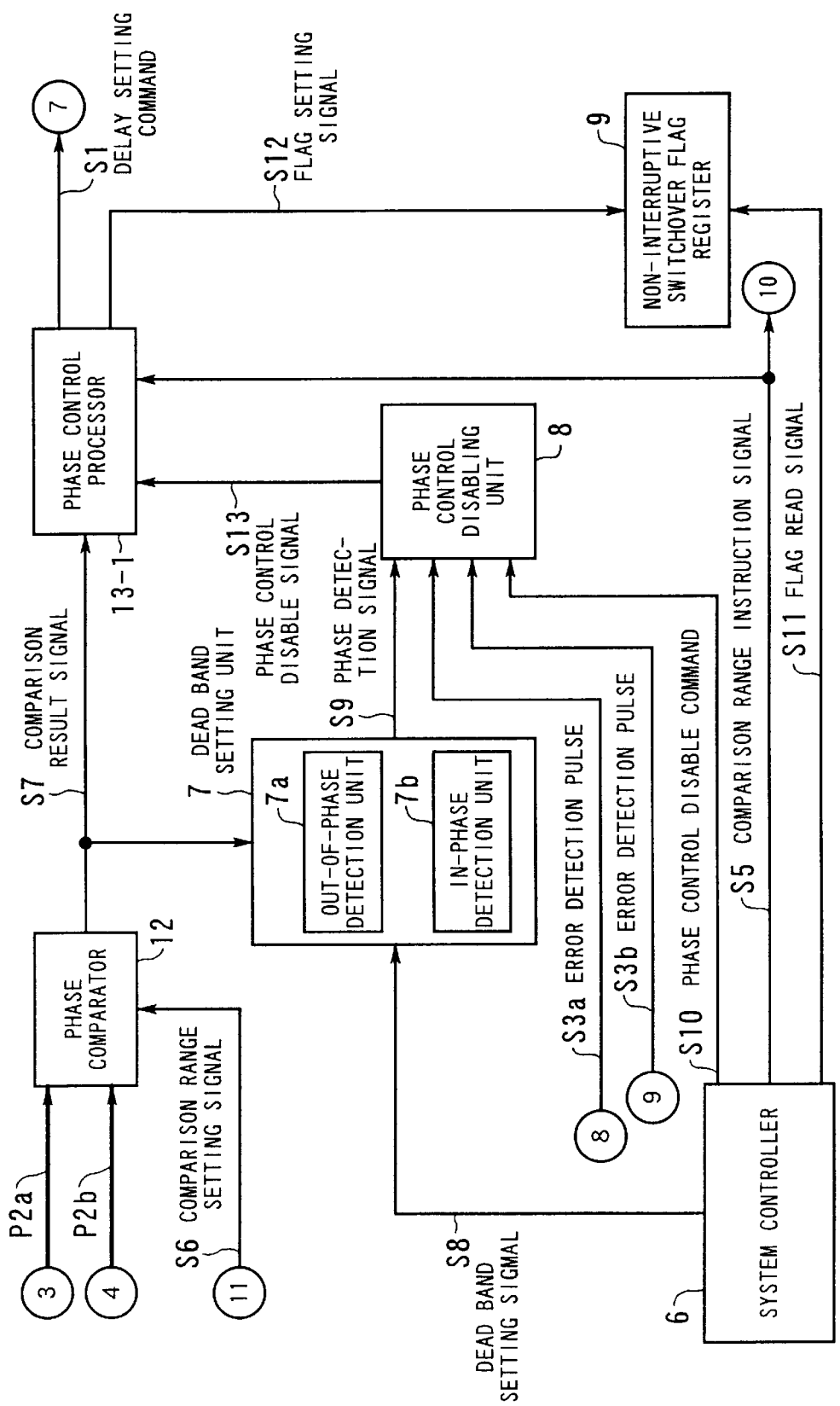

Now, the next section will explain the detailed configuration and operation of the phase control apparatus 10 with a non-interruptive switchover function, as a first embodiment of the present invention. FIGS. 3 to 5 are a block diagram of a phase control apparatus 10 of the first embodiment, where the bold arrows represent the flow of path signals, while the thin arrows indicate control signals. Numbers enclosed in the circles are connection identifiers that interconnect the same signals across different pages.

The reception interface units 1a and 1b receive optical signals transmitted over two different transmission media, and after converting them into electrical signals, they output two path signals P1a and P1b. Delay memory units M1 and M2 serve as a buffer for these received path signals P1a and P1b, giving a delay to either of them in accordance with a delay time parameter D. The resultant delayed path signals, P2a and P2b, are then directed to a selector 5, where either one of these signals is chosen and sent out as a non-interruptive switched output signal. Although not explicitly shown in FIGS. 3 to 5, the selection of these path signals P2a and P2b is conducted under the control of the operator 20 through a system controller 6 (described later).

Frame pulse generator 2a and 2b detect the first bit position of each frame found in the path signal P1a and P1b to generate frame count pulses FPa and FPb in synchronization with them. More specifically, the frame pulse generators 2a and 2b detect the J1 byte in each POH of SDH frames, and produce a pulse signal at each detected position of the J1 byte. The delay setting unit 13-2, an integral part of the phase controller 13, sends the delay time parameter D to either delay memory unit, M1 or M2, according to a delay setting command S1 supplied from a phase control processors 13-1 (described later).

In FIG. 4, transmission line fault detectors 3a and 3b detect a fault in the transmission lines, including an "unequipped" condition of a path signal. If any line fault is observed, they generate an error detection pulse, S3a or S3b, to inform other functional units about the occurrence of a transmission line error. In parallel with this line fault detection, B3 error detectors 4a and 4b check the B3 byte of each POH in the path signals P1a and the P1b, respectively. If a B3 error (i.e., parity error) is detected, they generate an error detection pulse to report its occurrence. The B3 error detectors 4a and 4b adjust the timing of the error detection pulse in accordance with the delay time parameter D set in the delay memory units M1 and M2. This timing adjustment permits the error detection pulse to be synchronized with the frame timings of the delayed path signals P2a and P2b. Finally, the error information is supplied to a comparison range setting unit 11 in the form of B3 error detection pulses S4a or S4b.

The comparison range setting unit 11 determines a phase comparison range, based on the B3 error detection pulses S4a and S4b, the frame count pulses FPa and FPb, and a comparison range instruction signal S5 sent from a system controller 6. The comparison range setting unit 11 outputs a comparison range setting signal S6 to indicate the determined comparison range. This signal S6 is driven, for example, to a high level ("H") for a time range where the phase comparison should take place.

Referring to FIG. 5, a system controller 6, inclusive of the aforementioned status reporting unit 6-1, supervises the phase control apparatus 10 in accordance with external instructions from the operator 20 or the like. More specifically, the operator 20 participates in setting the following control signals: comparison range instruction signal S5, dead band setting signal S8, phase control disable command S10, and flag read signal S11.

The phase comparison between the delayed path signals P2a and P2b is conducted actually by a phase comparator 12, according to the comparison range set by the comparison range setting signal S6. This yields a comparison result signal S7, which exhibits a high level ("H") for in-phase conditions and a low level ("L") for out-of-phase conditions.

A dead band setting unit 7 contains an out-of-phase detection unit 7a and an in-phase detection unit 7b. The out-of-phase detection unit 7a recognizes an out-of-phase condition when a phase difference is detected consecutively a predetermined number of times. The out-of-phase condition, when detected, is notified to a phase control disabling unit 8 via a phase detection signal S9. Since it makes the system insensitive to momentary phase mismatch, the above predetermined number is referred to as a "dead band parameter," which is set by a dead band setting signal S8.

The in-phase detection unit 7b, on the other hand, recognizes an in-phase condition when no phase difference is detected consecutively a predetermined number of times, and this in-phase condition is notified to the phase control disabling unit 8 via the phase detection signal S9. Here, the in-phase detection unit 7b uses the same dead band parameter provided through the dead band setting signal S8.

The phase detection signal S9, the error detection pulses S3a and S3b, and the phase control disable command S10 are entered to a phase control disabling unit 8. The phase control disabling unit 8 performs a logical OR operation for these four signal inputs to produce a phase control disable signal S13.

Serving as another integral part of the phase controller 13, a phase control processor 13-1 outputs a delay setting command S1 on the basis of the comparison range instruction signal S5, when the comparison result signal S7 exhibits the presence of a phase difference. When the phase control disable signal S13 is activated, the phase control processor 13-1 stops the phase control process.

A non-interruptive switchover flag register 9 hold a non-interruptive switchover flag, which is set or reset in accordance with a flag setting signal S12 supplied from the phase control processor 13-1. More specifically, the flag is set to "1" when the path signals are in phase, while it is reset to "0" when the path signals are out of phase. The status of the non-interruptive switchover flag is read out and sent to the operator 20 (not illustrated) when the system controller 6 activates a flag read signal S11.

As discussed above, the phase control apparatus 10 of the present invention is configured to test the phase relationships between the two path signals P2a and P2b that are delayed by the delay memory units M1 and M2, and to repetitively vary the delay time parameter D being set in the delay memory units M1 and M2 until an in-phase condition is reached. The proposed phase control apparatus 10 does not require the sending end to insert identifiers to the transmission frames, but achieves phase synchronization totally at the receiving end.

In addition, the dead band setting unit 7 is employed to introduce a certain range of dead band to the evaluation of phase comparison results. This contributes to improvements in reliability of phase detecting operations, since such a dead band makes the system less sensitive to momentary or transient events. That is, once the in-phase condition is established, it is not smart to immediately discard the present setup in response a momentary loss of phase synchronization. While the in-phase condition might be disturbed by a bit error or the like that could happen in one or both of the two path signals, such an out-of-phase condition cannot last for a long time, but the in-phase condition will soon be recovered. The phase control apparatus of the present invention is therefore designed to have an appropriate dead band mechanism to neglect a few consecutive occurrences of out-of-phase detection. For analogical reasons, the proposed apparatus is equipped with a like mechanism for the opposite situation where a momentary in-phase condition is observed while the path signals have long been out of phase.

Further, the phase control apparatus 10 detects faulty frames (B3 errors) and appropriately controls the comparison range, taking into consideration the effect of the delay memory units M1 and M2. This feature permits the phase comparator 12 to exclude such faulty frames from the subject of phase comparison.

Another distinct feature of the proposed phase control apparatus 10 is that the operator 20 can specify the pulse width of the comparison range setting signal S6 through the comparison range instruction signal S5. This introduces more flexibility to the phase control.

As still another feature of the proposed apparatus 10, the non-interruptive switchover flag register 9 effectively supplies the operator 20 with the present status information as to whether the non-interruptive switchover function is operational.

Figure 6:
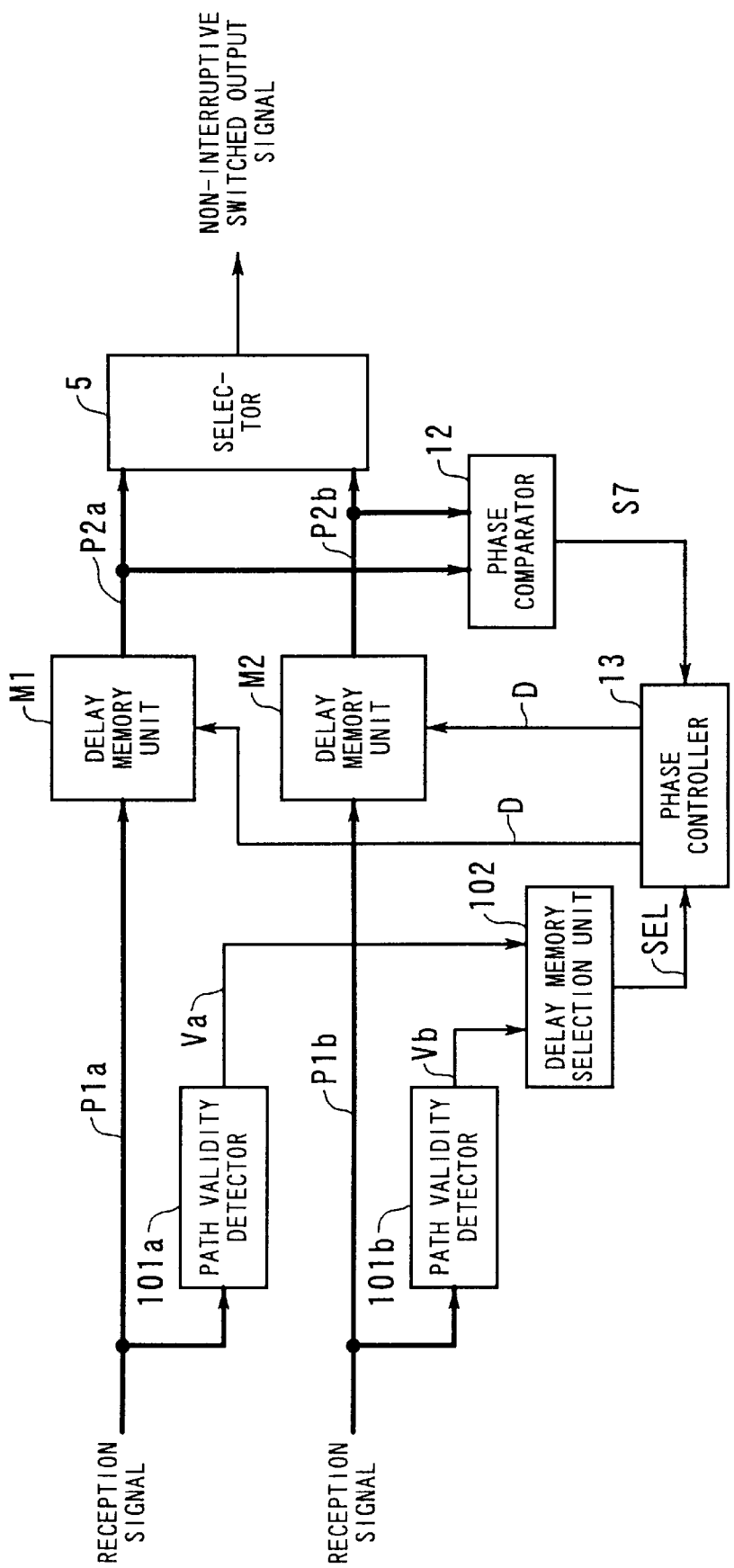
FIG. 6 is a diagram which shows the structure of a second embodiment of the present invention.

Moreover, the proposed apparatus 10 permits more flexible management of phase adjustment operations by handling various disabling conditions, such as transmission errors and a phase control disable command Referring next to FIG. 6, a second embodiment of the present invention will be described below. This second embodiment differs from the first embodiment in that it has an alternative policy of delay memory selection. That is, it first detects which path signal arrives earlier, and then gives a delay time parameter D to an appropriate delay memory unit accordingly. Since the phase control apparatus 10 of FIG. 6, however, has basically the same internal structure as the first embodiment, the following section omits the explanation for common part, while affixing like reference numerals to like elements.

In the second embodiment, the phase control apparatus 10 has path validity detectors 101a and 101b, which find a validity signal in path signals running on the transmission lines and generate path validity detection pulses Va and Vb, respectively. More specifically, the path validity detectors 101a and 101b observe the C2 byte of each POH in the received path signals P1a and P1b. This C2 byte indicates the content of a synchronous payload envelope, including "equipped/unequipped" status of the mapped payloads. An all-zeros bit pattern of the C2 byte means that the path is not equipped. Upon detection of the C2 byte, the path validity detectors 110a and 101b will produce path validity detection pulses Va and Vb. There must be a time difference between Va and Vb due to a distance difference between the two transmission lines.

With the path validity detection pulses Va and Vb supplied, a delay memory selection unit 102 produces a selection signal SEL to specify to which delay memory unit, M1 or M2, the delay time parameter D should be supplied. The phase controller 13 responds to this selection signal SEL by setting the delay time parameter D to the specified delay memory unit, when the comparison result signal S7 sent from the phase comparator 12 indicates a phase difference.

Figure 7:
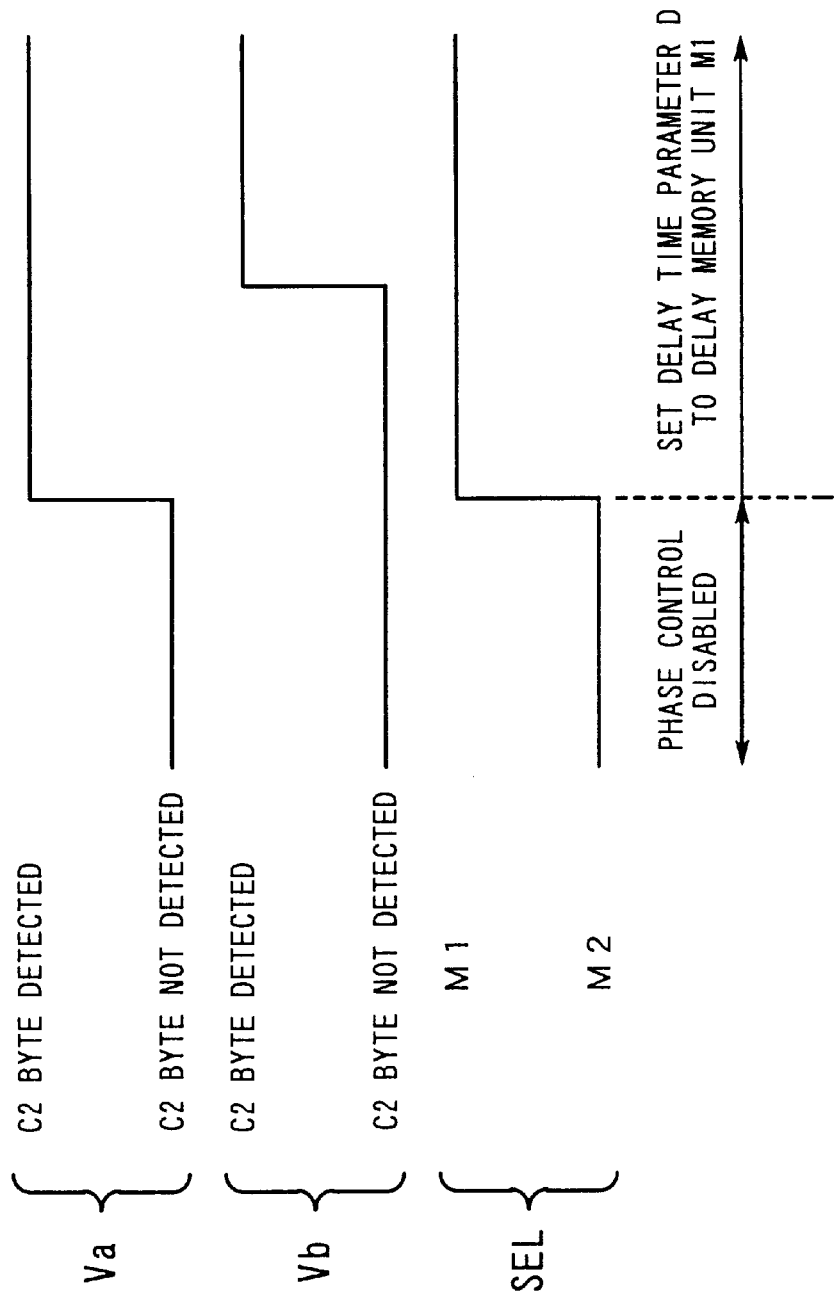
FIG. 7 is a timing diagram which shows how delay memory units are switched.

FIG. 7 is a timing diagram which shows a specific situation where the destination of the delay time parameter D is switched from M2 to M1. It is assumed here that "H" levels of the path validity detection pulses Va and Vb represent that the C2 byte has been detected. It is also supposed that the selection signal is driven "H" for the delay memory unit M1, and "L" for the delay memory unit M2.

FIG. 7 depicts a situation where the path validity detector 101a has generated a path validity detection pulse Va earlier than the other detector 101b, and thus the selection signal SEL changes to "H," thereby choosing the delay memory unit M1 as the destination of the delay time parameter D. FIG. 7 also indicates that the phase control is disabled while the path validity detection pulses Va and Vb are both at "L" levels.

As alternative method to detect the validity of path signals, it is possible to observe the recovery from Path Alarm Indication Signal (P-AIS), instead of monitoring the C2 byte. P-AIS is defined as an all-ones bit pattern in the payload pointer bytes in an SDH frame, and the path validity can be detected by monitoring the changes in this special bit pattern of P-AIS. When the P-AIS bit pattern in one path signal has disappeared earlier than the other, that path signal is considered to have a smaller delay. The validity detectors 101a and 101b then generate path validity detection pulses Va and Vb.

Figure 8:
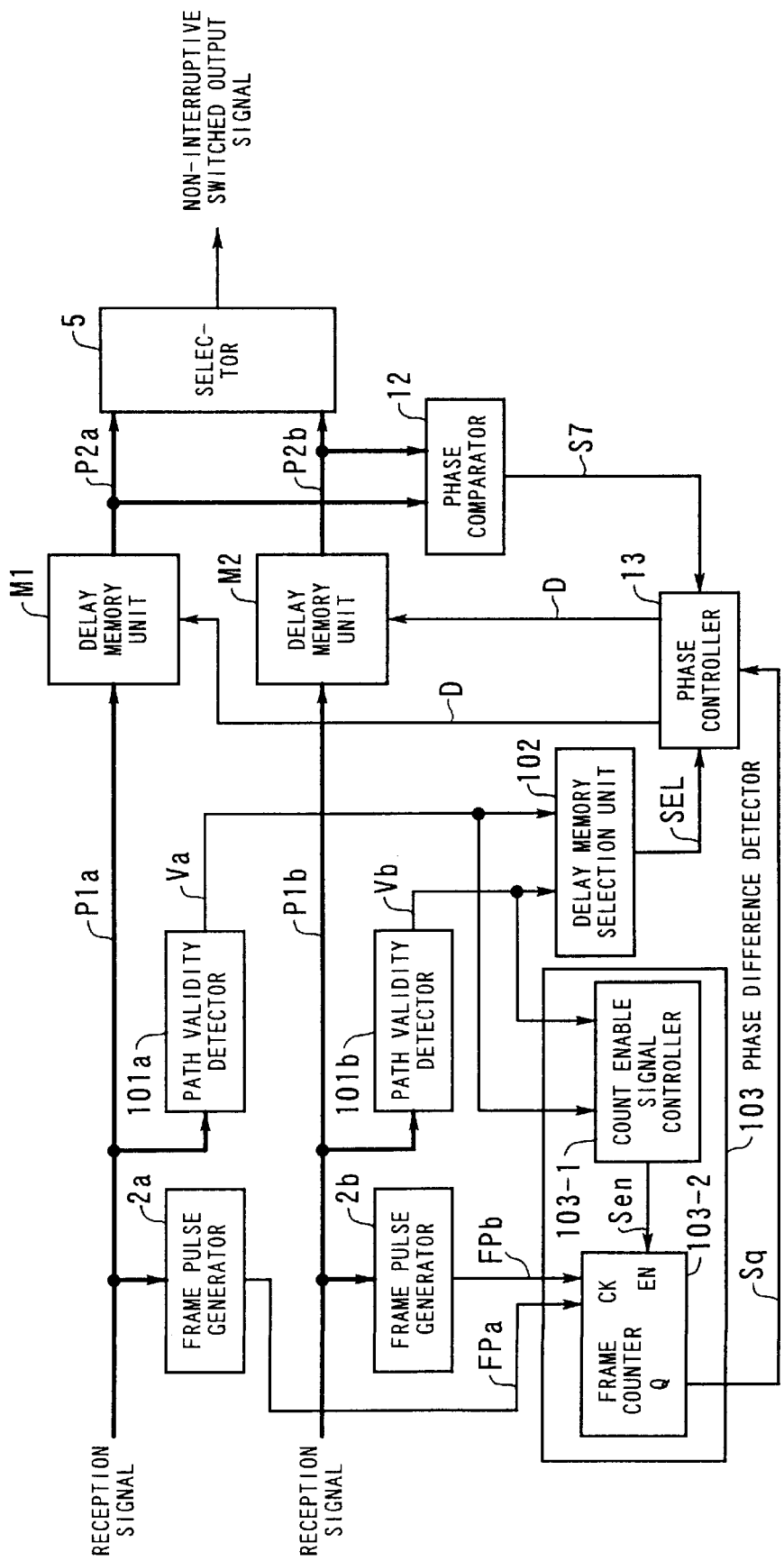
FIG. 8 is a diagram which shows the structure of a third embodiment of the present invention.

Referring next to FIG. 8, a third embodiment of the present invention will be described below. This third embodiment is distinct from the first embodiment in that it employs a phase difference detector 103 to detect the amount of a phase difference. Because of the similarity to the first embodiment in its basic structure, like reference numerals are affixed to like elements in FIG. 8.

The phase difference detector 103, having a count enable signal controller 103-1 and a frame counter 103-2, detects a phase difference between two path signals P1a and P1b by measuring the interval between two path validity detection pulses generated at different times. More specifically, the count enable signal controller 103-1 generates a count enable signal Sen from the path validity detection pulses Va and Vb, so that the frame counter 103-2 will start at the first path validity detection pulse and stop at the second pulse. Receiving frame count pulses FPa and FPb as its clock signals, the frame counter 103-2 counts frames while the count enable signal Sen is active. The output of the frame counter 103-2, named a phase difference signal Sq, is then supplied to the phase controller 13 to determine the delay time of the delay memory units M1 and M2.

Figure 9:
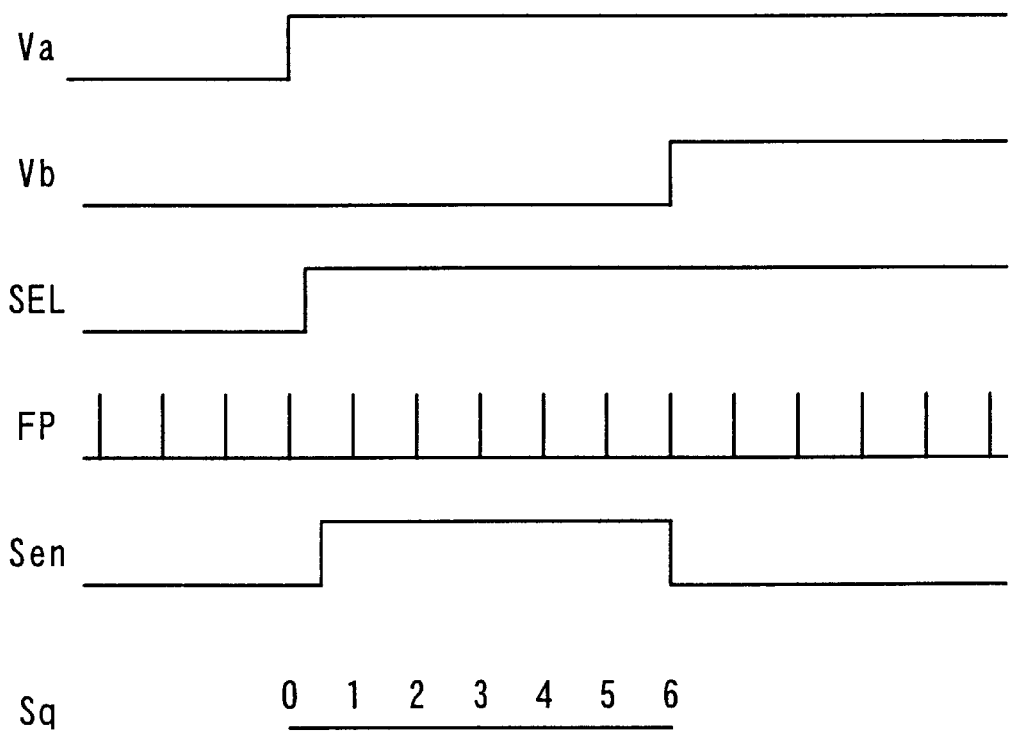
FIG. 9 is a timing diagram which shows how a phase difference is detected.

FIG. 9 is a timing diagram which shows how a phase difference will be detected. It is assumed here that the phase control apparatus 10 has selected the delay memory unit M1 through the same process as explained in FIG. 7. The count enable signal Sen is produced as shown in FIG. 9, since the path validity detection pulse Va changed first and the other pulse Vb has followed it. Recall here that the frame count pulses FPa and FPb are entered to the frame counter 103-2. FIG. 9 shows a signal FP to represent those pulses after dividing them by two for easier understanding, each FP pulse indicating one frame. Six frame pulses are entered to the frame counter 103-2 during the time Sen is at a "H" level, meaning that the path signals have a phase difference of about six frame intervals. This information is sent to the phase controller 13 by the phase difference signal Sq.

Figure 10:
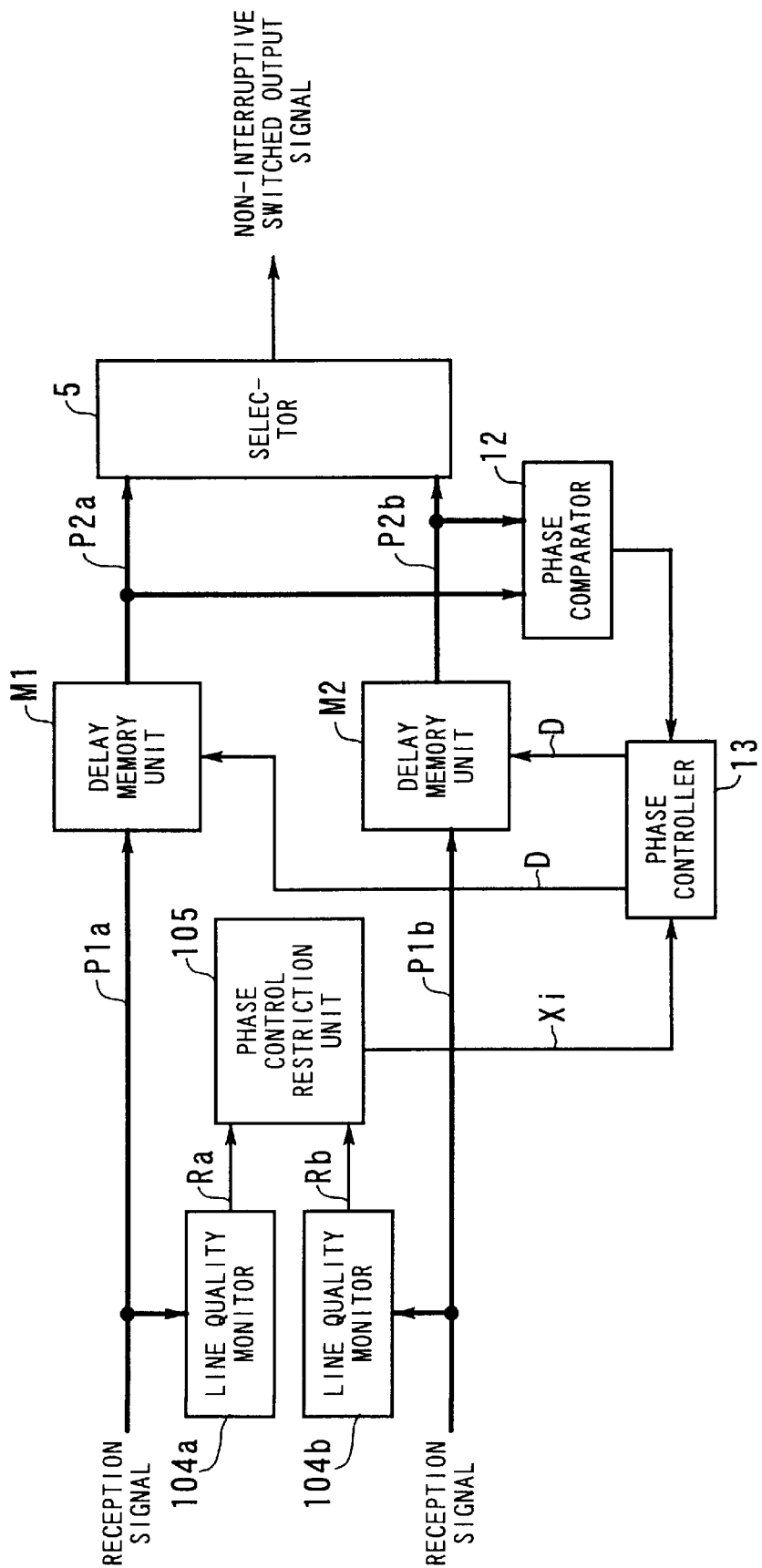
FIG. 10 is a diagram which shows the structure of a fourth embodiment of the present invention.

Referring next to FIG. 10, a fourth embodiment of the present invention will be described below. This fourth embodiment is distinct from the first embodiment in that its phase control takes the quality status of transmission lines into consideration.

More specifically, line quality monitors 104a and 104b watch the line quality levels of transmission lines, and generate line quality status signals Ra and Rb, respectively. On the basis of these line quality status signals Ra and Rb, a phase control restriction unit 105 determines the maximum number of times a delay time parameter D can be set. The determined maximum number of times, or a restriction factor Xi, is given to the phase controller 13 so that the phase control scheme be affected by this factor Xi.

FIG. 11 illustrates a table that associates line quality levels with restriction parameters that determine how many times the delay time setting operations can be repeated. This table 105-1 consists of a line quality field R and a delay restriction parameter field X. Take the second table entry for the line quality level $R=10^{-4}$ for example. The table 105-1 gives a value of zero to the relevant delay restriction parameter X (i.e., no phase control performed), because this poor quality level cannot justify the execution of phase control processes. Consider another case where the line quality level is $R=10^{-5}$, which is deemed to be a tolerable quality condition. The delay restriction parameter X is set to 15, permitting the phase control apparatus 10 to seek an in-phase condition in a wider time range. Now, take still another example situation where the transmission line exhibits an excellent quality level, $R=10^{-8}$. In this case, the delay restriction parameter X is reduced to one in order to suppress the execution of unnecessary phase control.

As described above, the phase control apparatus 10 of the present invention is configured to test the phase relationships between two path signals P2a and P2b that have been delayed by two delay memory units M1 and M2, respectively. The delay time parameter D is repetitively varied and supplied to the delay memory units M1 and M2 until an in-phase condition is reached. Unlike the conventional apparatus, which has to measure a time difference between two identifiers, the proposed phase control apparatus 10 does not require the sending end to insert such identifiers to the transmission frames, but efficiently achieves phase synchronization totally at the receiving end.

Figure 12:
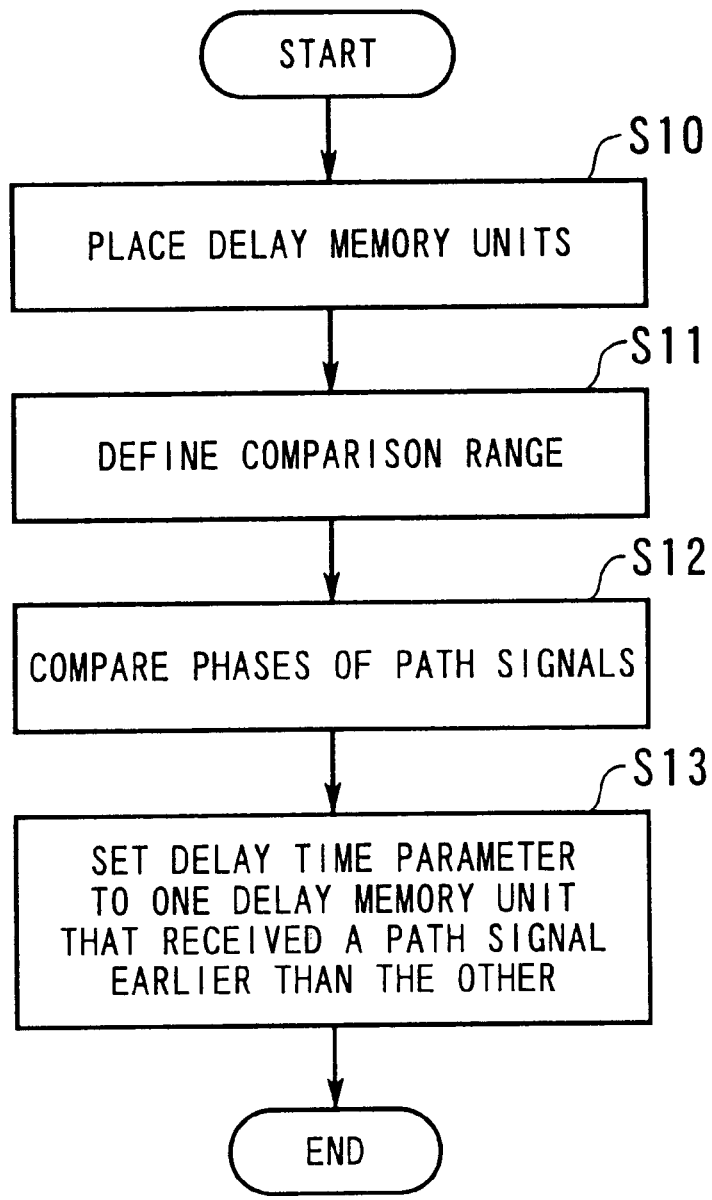
FIG. 12 is a flowchart which shows a process according to a phase control method of the present invention.
Figure 13:
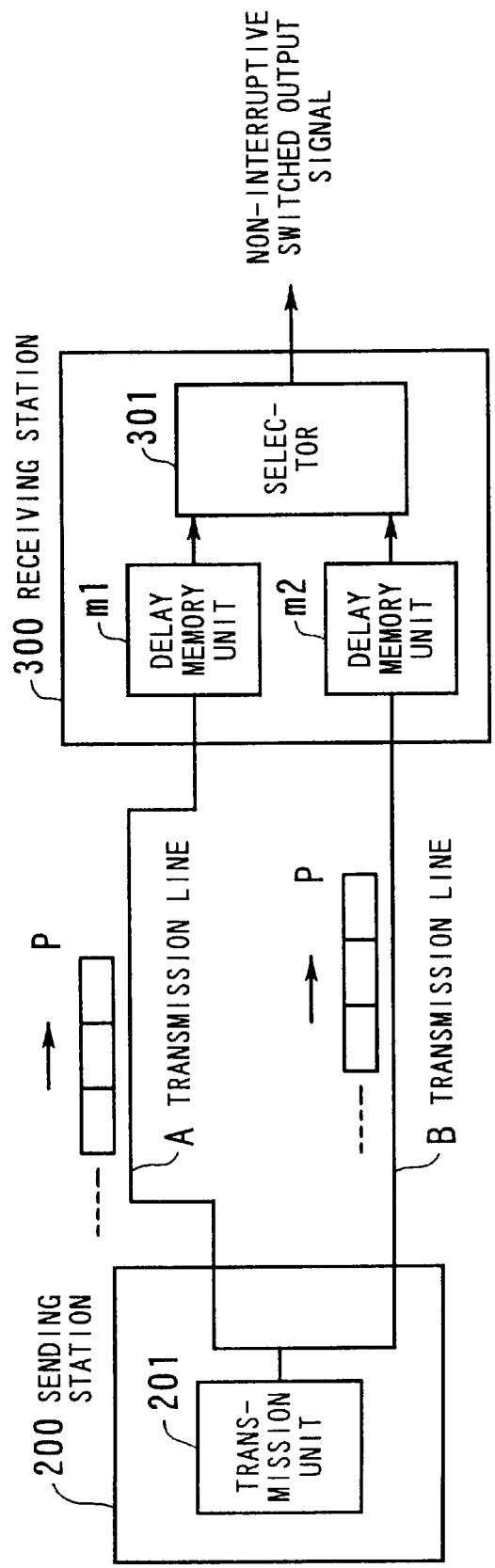
FIG. 13 is a diagram which outlines a conventional dual-line signal transmission system having a non-interruptive switchover capability.
Figure 14:
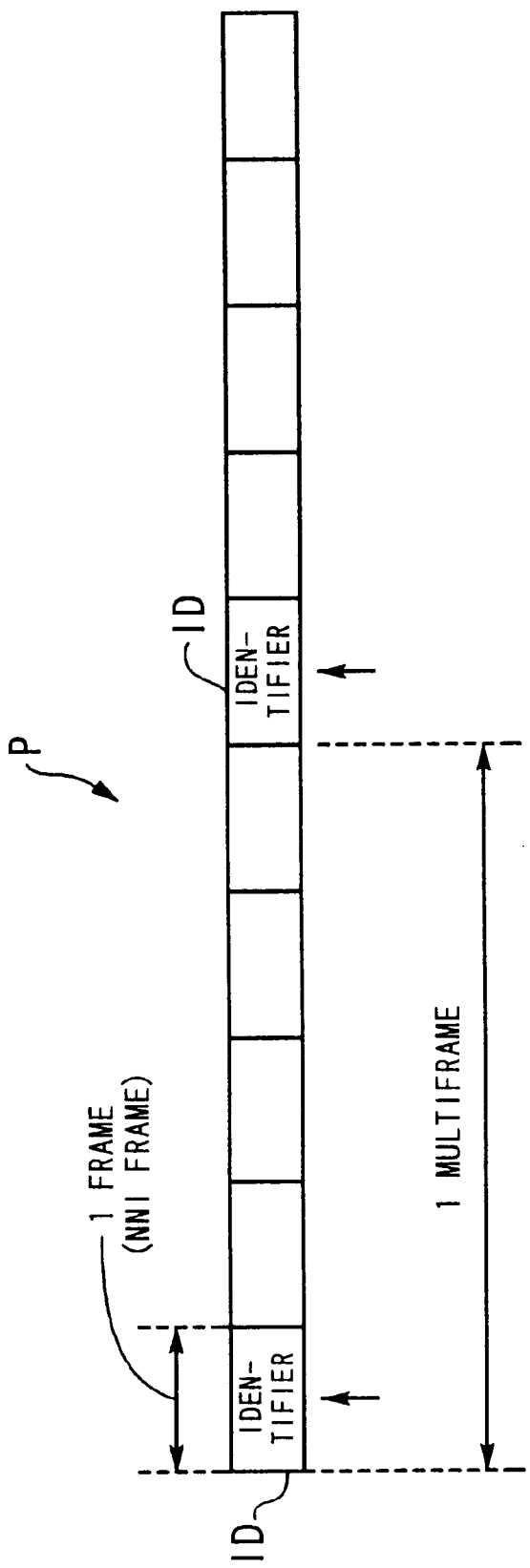
FIG. 14 is a diagram which shows a conventional frame structure of path signals.

Referring next to FIG. 12, a phase control method of the present invention will be described below. FIG. 12 is a flowchart which shows a process according to the phase control method of the present invention, which comprises the following steps:

(S10) Delay memory units are placed on the individual transmission lines.

(S11) A comparison range is defined.

(S12) The phase relationships between two delay memory units' outputs within the comparison range defined in step S11.

(S13) If the comparison in step S12 has resulted in an out-of-phase condition, the delay time parameter is repetitively varied and set to one of the delay memory units that received a path signal earlier than the other.

As described above, the phase control method of the present invention compares the output signal phases of delay memory units, and if they do not match, repetitively sets a different delay time to one of the delay memory units that received a transmission signal earlier. This reduces the time required for phase control, thus improving the efficiency in phase control.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A phase control apparatus for performing a phase control to eliminate a phase difference between two reception signals which originate from a single source, but have been carried over two transmission lines, comprising:

first and second delay memory units, respectively disposed on the two transmission lines, which delay the reception signals in accordance with a given delay time parameter;

comparison range setting means for setting a time range for phase comparison between the two reception signals;

phase comparison means for comparing phases of the two reception signals delayed by said first and second delay memory units, within the time range set by said comparison range setting means; and phase control means for executing the phase control by repetitively varying the delay time parameter being set in either of said first and second delay memory unit, while a phase difference is observed by said phased comparison means.

2. The phase control apparatus according to claim 1, wherein said phase control means begins to set the delay time parameter to said second delay memory unit when the phase difference cannot be eliminated by repetitively varying the delay time parameter being set in said first delay memory unit.

3. The phase control apparatus according to claim 1, further comprising out-of-phase detection means for recognizing an out-of-phase condition when a phase difference has been consecutively detected a predetermined number of times.

4. The phase control apparatus according to claim 1, further comprising in-phase detection means for recognizing an in-phase condition when no phase difference has been consecutively detected a predetermined number of times.

5. The phase control apparatus according to claim 1, wherein said phase comparison means compares the phases at every frame interval.

6. The phase control apparatus according to claim 5, wherein said phase control means performs the phase control, excluding a frame having an error.

7. The phase control apparatus according to claim 1, wherein said phase control means disables the phase control while either or both of the transmission lines have an error.

8. The phase control apparatus according to claim 1, further comprising status reporting means for informing an external recipient of an in-phase condition or an out-of-phase condition of the two reception signals delayed by said first and second delay memory units.

9. The phase control apparatus according to claim 1, further comprising phase control disabling means for disabling the phase control according to a signal from an external source.

10. The phase control apparatus according to claim 1, wherein said phase control means clears the delay time parameter being set in said first delay memory unit, when the phase difference cannot be eliminated by repetitively varying the delay time parameter being set in said first delay memory unit.

11. The phase control apparatus according to claim 1, further comprising line quality monitoring means for monitoring line quality levels of the transmission lines.

12. The phase control apparatus according to claim 11, further comprising phase control restriction means for limiting the number of times the delay time parameter can be set to said first and second delay memory unit, according to the line quality levels being monitored by said line quality monitoring means.

13. The phase control apparatus according to claim 1, further comprising validity detection pulse generation means for generating a validity detection pulse when a validity signal is found in the two reception signals carried over the transmission lines.

14. The phase control apparatus according to claim 13, further comprising delay memory selection means for selecting said first or second delay memory unit that has received the validity signal, based on the validity detection pulse.

15. The phase control apparatus according to claim 14, wherein said phase control means sets the delay time parameter to said first or second delay memory unit selected by said delay memory selection unit.

16. The phase control apparatus according to claim 13, further comprising phase difference detection means for detecting the phase difference by observing two consecutive validity detection pulses generated by said validity detection pulse generation means.

17. The phase control apparatus according to claim 16, wherein said phase control means determines the delay time parameter, based on the phase difference detected by said phase difference detection means.

18. A method of eliminating a phase difference between two signals which originate from a single source, but have been carried over two transmission lines, comprising the steps of:

(a) placing delay memory units on the individual transmission lines;

(b) defining a time range for phase comparison;

(c) comparing phases of output signals of the delay memory units, within the time range defined in said step (b) of defining; and (d) when the phase comparison in said step (c) of comparing has resulted in an out-of-phase condition, repetitively varying a delay time parameter being set in one of the delay memory units that has received earlier the signal carried over the transmission line.

* * * * *